United States Patent [19]

Gupta et al.

[11] Patent Number: 4,568,565
[45] Date of Patent: Feb. 4, 1986

[54] LIGHT INDUCED CHEMICAL VAPOR DEPOSITION OF CONDUCTIVE TITANIUM SILICIDE FILMS

[75] Inventors: Arunava Gupta, Madison; Gary A. West, Dover; Karl W. Beeson, Princeton, all of N.J.

[73] Assignee: Allied Corporation, Morris Township, Morris County, N.J.

[21] Appl. No.: 609,627

[22] Filed: May 14, 1984

[51] Int. Cl.$^4$ .......................... B05D 3/06; B05D 5/12
[52] U.S. Cl. .............................. 427/53.1; 204/157.41; 427/93; 427/255.2; 428/689
[58] Field of Search ................. 204/157.1 R, 157.1 L; 423/341; 427/53.1, 87, 93, 255.2; 428/689

[56] References Cited

U.S. PATENT DOCUMENTS

| | | | |
|---|---|---|---|
| 3,364,087 | 1/1968 | Solomon et al. | 118/641 X |
| 4,042,006 | 8/1977 | Engl et al. | 427/43.1 X |
| 4,227,907 | 10/1980 | Merritt | 65/3 |
| 4,260,649 | 4/1981 | Dension et al. | 427/53.1 |
| 4,270,997 | 6/1981 | Merritt | 204/157.1 |
| 4,324,854 | 4/1982 | Beauchamp et al. | 430/296 |

FOREIGN PATENT DOCUMENTS 0123309 4/1984 European Pat. Off. .

OTHER PUBLICATIONS

Nancy Stauffer, The Industrial Liaison Program of the Massachusetts Institute of Technology, Jul./Aug. 1984, vol. XII, No. 7, "Reports on Research", pp. 1 and 2.
Murarka, Refractory Silicides for VSLI Production, Academic Press, 1983, pp. 115-131.
Proceedings of the Eighth International Conference on Chemical Vapor Deposition, Electrochemical Society, Pennington, NJ 1981, pp. 685-698.
Cold Wall, Low Pressure CVD Reactor, Solid State Technology, Nov. 1983, pp. 63-64.
Brors et al., Properties of Low Pressure CVD Tungsten Silicide as Related to IC Process Requirements, Solid State Technology, Vo. 26, Apr. 1983, pp. 183-186.
Plasma Titanium-Silicide . . . Path of Least Resistance. Solid State Technology, Jan. 1984, p. 37.
Bilenchi et al., Laser-Enhanced Chemical Vapor Deposition of Silicon; Proceedings of the Eighth International Conference on Chemical Vapor Deposition, Electrochemical Society, Pennington, NJ, 1981, pp. 275-283.
Gattuso et al., IR Laser-Induced Deposition of Silicon Thin Films, Mat. Res. Soc. Proc., vol. 17, 1983, pp. 215-222.
Allen et al., Summary Abstract: Properties of Several Types of Films Deposited by Laser CVD, Vac. Sci. Technol., Mar. 1983.
Meunier et al., Hydrogenated Amorphous Silicon Produced by Laser Induced Chemical Vapor Deposition of Silane, Appl. Phys. Lett 43(3), Aug. 1, 1983, pp. 273-275.
Steinfeld, Laser-Induced Chemical Reactions: Survey of the Literature, 1965-1979, Plenum: NY 1981, pp. 243-267.
Shibata, T. et al., "Metal Silicon Reactions Induced by CW Scanned Laser and Electron Beams," *J. Electrochem. Soc.*, vol. 128, No. 3, Mar. 1981, pp. 637-644.

*Primary Examiner*—Michael R. Lusignan
*Attorney, Agent, or Firm*—Gus T. Hampilos; Gerhard H. Fuchs

[57] ABSTRACT

Conductive titanium silicide-containing films and composites comprising substrates and the film are produced by light induced chemical vapor deposition. The process eliminates the need to anneal the silicide film in order to produce a conductive film and overcomes the problem of substrate damage associated with high temperature deposition processes. The process comprises the steps of: exposing gas phase reactants comprising a titanium halide and a silicon containing compound to high intensity light; exposing a preheated substrate to the exposed gases to cause a conductive titanium silicide film to be formed thereon; and, maintaining the substrate, throughout the process, at a temperature below that temperature which would induce a thermal reaction between the gas phase reactants. The films and composites produced by the process are particularly suited for use in VLSI and VVLSI production.

23 Claims, 7 Drawing Figures

LIGHT INDUCED CHEMICAL VAPOR DEPOSITION OF CONDUCTIVE TITANIUM SILICIDE FILMS

This application is related to Ser. No. 609,629, filed May 14, 1984 entitled "LIGHT INDUCED PRODUCTION OF ULTRAFINE POWDERS COMPRISING METAL SILICIDE POWDER" and Ser. No. 609,628, filed May 14, 1984 entitled "PROCESS FOR PRODUCING CONDUCTIVE METAL SILICIDE FILMS FROM ULTRAFINE POWDERS."

FIELD OF THE INVENTION

This invention relates to the production of conductive titanium silicide-containing films and composites comprising substrates and the films. More particularly, it relates to the production of conductive titanium silicide-containing films formed on a substrate from gas phase reactants which have been exposed to high intensity light. Specifically, the invention is directed to light induced chemical vapor deposition of a polycrystalline titanium silicide-containing thin film on a preheated substrate from gaseous reactives comprising a titanium halide and a silicon-containing compound. The films and composites are ideally suited for use in VLSI and VVLSI production.

BACKGROUND OF THE INVENTION

The evolution of the electronics industry in recent years has resulted in a steady decrease of integrated circuit feature sizes. With the introduction of the 256K chip and research on the 512K chip in progress, feature sizes are shrinking to such a degree that many of the traditional semiconductor progressing techniques are no longer adequate. Until recently, doped polysilicon has been used extensively as a conductor for gate interconnects on metal-oxide semiconductor (MOS) devices. Doped polysilicon was chosen because it can withstand subsequent high temperature processing steps and because it has electrical properties, such as a bulk resistivity of about 1,000 $\mu\Omega$-cm, which are desirable. As conductor line widths are reduced to below $2\mu$, however, the resistance of polysilicon conductive lines is large enough to degrade the high speed performance of devices. Thus, with minimum feature sizes of $1\mu$ or less, the electronics industry has looked to refractory metal silicides as a solution to gate interconnect problems in high density chip production.

Refractory metal silicides are now being used in place of polysilicon or in addition to polysilicon (as a two layer polysilicon-silicide conductor sometimes referred to as a polycide). Refractory metal silicides have very low bulk resistivities (approx. 15–100 $\mu\Omega$-cm), can withstand temperatures in excess of 1,000° C. and, in general, do not oxidize easily. The silicides commonly associated with the formation of gate interconnects are titanium silicide ($TiSi_2$), tungsten silicide ($WSi_2$), molybdenum silicide ($MoSi_2$) and tantalum silicide ($TaSi_2$).

Currently, a variety of methods are employed to produce conductive silicide coatings. They include sputtering or cosputtering techniques, evaporation or coevaporation processes, chemical vapor deposition processes requiring high substrate temperature (pre- or post-deposition), and plasma induced chemical vapor deposition. For a detailed discussion of many of these methods see Murarka, *Refractory Silicides for VSLI Production*, Academic Press, 1983, pp. 115–131.

Sputtering techniques employ target materials which are bombarded by energized ions to free atoms of the materials for deposition onto a substrate. The techniques include sputtering of a metal on silicon or polysilicon or simultaneously sputtering from two targets (cosputtering). Both techniques employ radio frequency (RF, plasma) or direct current (DC) magnetron sputtering for silicide formation.

DC magnetron sputtering is of limited use because it requires that the target material be a conductor. Thus, when a metal target and a silicon target are employed as in a cosputtering process, the silicon target must be doped to make it a good conductor. Consequently, the resultant silicide layer may include an unwanted dopant.

Sputtering techniques cause gas entrapment and/or contamination to occur in the deposited layer. The bombarding ions are gas ions which become entrapped in the silicide layer. These gas ions can chemically contaminate the layer if the gas contains a chemically reactive impurity.

Silicide coatings produced by the physical deposition process of sputtering or cosputtering are invariably amorphous. These amorphous coatings have a high resistivity as deposited and must be annealed at 900° C.–1,100° C. for 0.5–1.0 hr. to produce high quality coatings of low resistivity. A high temperature anneal (greater than about 1,000° C.) can create warpage of the silicon chip which makes subsequent lithography difficult. Additionally, at 1,000° C. or higher, dopant diffusion becomes a significant factor and can result in unwanted alteration of dopant profiles.

Poor step coverage is another drawback associated with sputtering or cosputtering. Because the topography of the wafer surface is varied, good step coverage is necessary to avoid degradation or failure of the device. Sputtered and cosputtered layers exhibit poor step coverage as compared to other prior art processes. The result of poor step coverage is localized thin spots which can produce overheating, electromigration of the conductor and, consequently, premature failure of the device.

Evaporation techniques include evaporation of metal on silicon or polysilicon and coevaporation of metal and silicon on silicon, polysilicon or oxides. The techniques use heat (resistive, inductive (RF), electron bombardment or laser) to vaporize the elements which are deposited on the substrate surface. One problem specifically associated with coevaporation is consistency of the silicide composition from run to run. In addition, electron guns, commonly used as the heat source for refractory metal silicide formation, cause radiation damage to the substrate.

Regardless of the specific evaporation process employed, formation of a highly conductive silicide layer requires post deposition processing at temperatures of 900° C.–1,100° C. As with sputtering processes, high temperature (greater than 1000° C.) post deposition processing steps can cause substrate warpage and significant dopant diffusion. Furthermore, step coverage by evaporation techniques is generally no better than the coverage produced by sputtering techniques.

Chemical vapor deposition (CVD) of silicides requires a chemical reaction of materials in the vapor phase or a reaction which occurs on the substrate surface. Chemical vapor deposition requires a high substrate temperature to produce a conductive coating (1,000° C.–1,100° C. for $TiSi_2$, see Wahl et al., "The CVD Deposition of Ti-Si Containing Coatings on Ni-Base Superalloys," *Proceedings of the Eighth International Conference on Chemical Vapor Deposition,* Electrochemical Society, Pennington, N.J., 1981, pp. 685–98. These high temperature processing requirements induce the same problems which occur during sputtering and evaporation post deposition treatments. However, unlike the step coverage problems associated with sputtering or evaporation of silicide films, CVD films exhibit good step coverage.

Cold wall, low pressure CVD processes have developed quite recently as an alternative to high substrate temperature processes. Examples of this process are described in "Cold Wall, Low Pressure CVD Reactor" *Solid State Technology,* November 1983, pp. 63–4 and Brors et al., "Properties of Low Pressure CVD Tungsten Silicide as Related to IC Processing Requirements," *Solid State Technology,* Vol. 26, April 1983, pp. 183–6. The product, produced on a substrate heated to a low temperature, is either microcrystalline or amorphous. In order to produce a conductive layer, however, a high temperature anneal (1,000° C.–1,100° C.) is required for either process. Again, this high temperature post deposition treatment can cause substrate warpage and unwanted dopant profile changes.

A plasma induced CVD process is briefly disclosed in "Plasma Titanium-Silicide—Path of Least Resistance," *Solid State Technology,* January 1984, p. 37. Although this process employs somewhat lower processing temperatures, a principal drawback of this process is the distinct possibility of radiation damage to the substrate.

In an effort to reduce the effects of high temperature processing, lasers and electron or ion beams are used to anneal the layers. These heat treatment processes localize the heat and are needed only for a very short time to produce the conductive layer. See, for example, Murarka, supra, p. 128.

Most recently, laser induced chemical vapor deposition (LCVD) has been used to produce semiconducting, insulating and conductive (metal) coatings. The laser induced reactions cause the gaseous constituents to react and produce a coating on the substrate. References discussing the production of Si semiconductive layers, oxide and nitride insulating layers and conductive metal layers include: U.S. Pat. No. 4,227,907; U.S. Pat. No. 4,270,997; U.S. Pat. No. 4,260,649; U.S. Pat. No. 4,324,854; Bilenchi et al., "Laser-Enhanced Chemical Vapor Deposition of Silicon," Proceedings of the Eighth International Conference on Chemical Vapor Deposition," Electrochemical Society, Pennington, N.J., 1981, pp. 275–83; Gattuso et al., "IR Laser-Induced Deposition of Silicon Thin Films," *Mat. Res. Soc. Proc.,* Vol. 17, 1983, pp. 215–22; Allen et al., "Summary Abstract: Properties of Several Types of Films Deposited by Laser CVD," *Vac. Sci. Technol.,* March 1983; and Meunier et al., "Hydrogenated Amorphous Silicon Produced by Laser Induced Chemical Vapor Deposition of Silane," *Appl. Phys. Lett.* 43(3), 1 August 1983, pp. 273–5. In addition, a comprehensive list of documented laser induced reactions is disclosed in Steinfeld, "Laser-Induced Chemical Reactions: Survey of the Literature, 1965–1979," Plenum: New York, 1981, pp. 243–67.

Until now, despite the recognition in the electronics industry that metal silicides are instrumental in VLSI and VVLSI production and notwithstanding the volumes of literature to date discussing the methods of forming coatings, production of satisfactory metal silicide coatings by a process which does not require high temperature processing steps to achieve a sound highly conductive layer has not been possible.

We have discovered a novel process for the production of conductive titanium silicide-containing films and composites. The process eliminates the high temperature processing steps normally required to form conductive titanium silicide-containing films. The process preferably employees a laser to induce chemical vapor deposition of a polycrystalline conductive titanium silicide-containing film on a substrate. The conductive films have an easily controllable composition and, when forming composites, the composites exhibit excellent step coverage. The novel process produces films and composites which are ideally suited for integrated circuit production.

SUMMARY OF THE INVENTION

The invention is directed toward the production of conductive films comprising polycrystalline titanium silicides. The process comprises the steps of: (a) providing a substrate to a processing site; (b) supplying gas phase reactants comprising titanium halide and a silicon-containing compound to the processing site; (c) exposing the gases at the processing site to high intensity light; (d) exposing a surface of substrate to the exposed gases to cause a film comprising titanium silicide to be deposited thereon; and, (e) maintaining the substrate, during steps (b), (c) and (d), at a predetermined temperature below that temperature which would induce a thermal reaction between the gas phase reactants. Typically, the substrate temperature is equal to or less than about 500° C. The preferred source of high intensity light is a laser. The thickness of the metal silicide containing film can be less than or equal to about $1\mu$ and the films exhibit bulk resistivities ($\rho$) less than about 300 $\mu\Omega$-cm. The composite comprises titanium silicide-containing films formed as layers on substrates. These substrates are preferably selected from the group consisting of silicon, polysilicon, doped polysilicon, alumina, silicon nitride or silica.

DETAILED DESCRIPTION OF THE INVENTION

Figure 1:
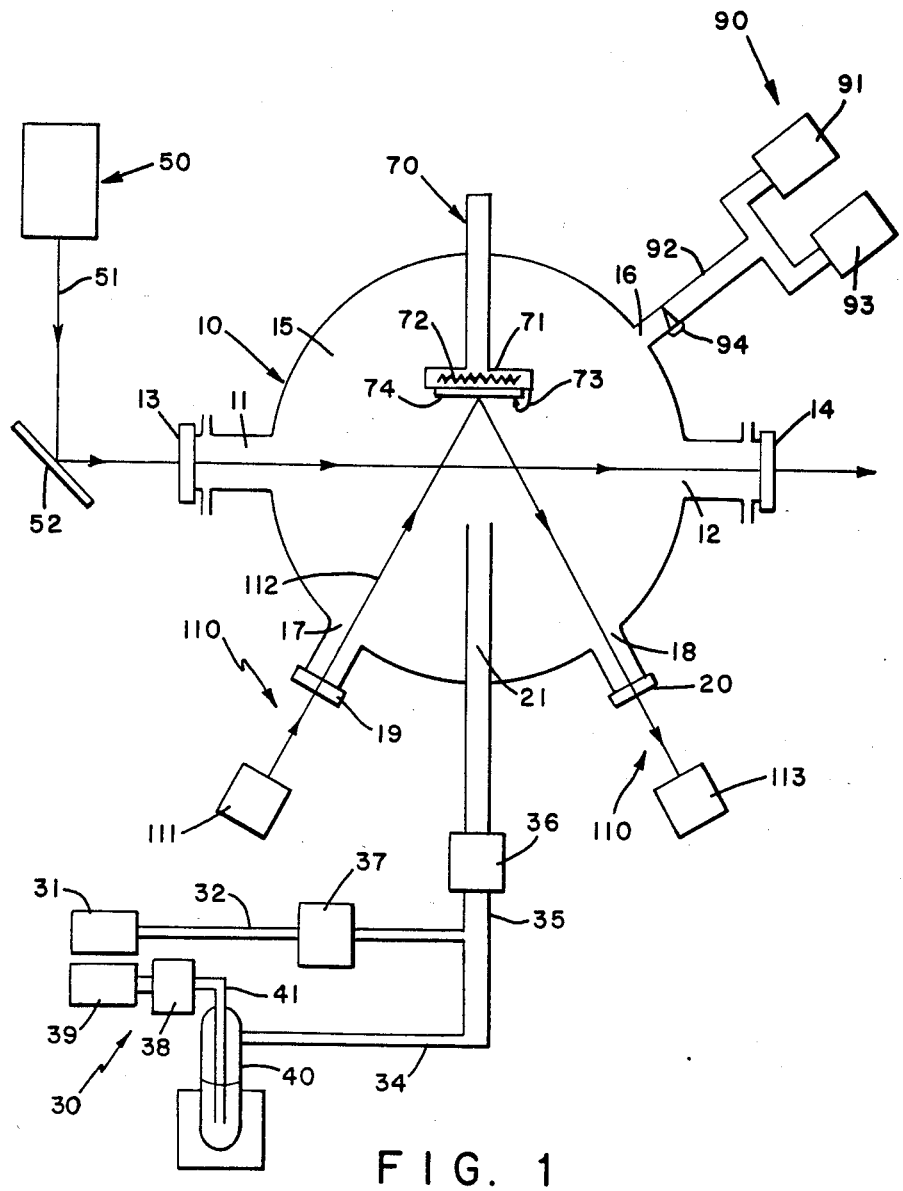
FIG. 1 is a schematic representation of the basic apparatus employed in carrying out the novel process.

FIG. 1 represents a preferred apparatus for practicing the invention comprising a reactor 10, a gaseous reactant delivery system 30, a high intensity light source 50, a substrate mounting mechanism 70, an evacuation system 90 and a reaction monitoring mechanism 110.

The reactor 10 is designed to include a number of ports. Arranged coaxially in side walls of the reactor 10 are light beam ports 11 and 12. The ports 11 and 12, provided with high intensity light transparent windows 13 and 14 (e.g., NaCl windows), allow the high intensity light emanating from a high intensity light source to pass through the reaction chamber 15 of the reactor 10. In addition to light beam ports 11 and 12, the reactor 10 is provided with an evacuation port 16 which is in fluid communication with a diffusion/mechanical pump combination and a chemically resistant mechanical pump. Detector ports 17 and 18, provided with laser beam transparent windows 19 and 20, respectively, are arranged to allow a detector beam emanating from a laser to pass through the detector port 17, strike a substrate mounted on a substrate mounting mechanism and pass through the detector port 18 after being reflected by the substrate. The gas reactant supply port 21 is arranged such that the gas reactants will be fed into the path of a high intensity light beam.

The gas reactant delivery system 30 feeds the gas reactants to the reaction chamber 15. The system comprises a source 31 of a silicon-containing compound and a source 33 of titanium halide. Gas reactants are supplied via separate supply lines 32 and 34 respectively to a mixing line 35. The mixing line 35, in fluid communication with the reactant supply port 21, preferably includes a particle filter 36 (e.g., a $2\mu$ pore size filter) which removes impurity particles. The gas reactant flow rates from the sources 31 and 33 are controlled by separate electronic mass flow control units 37 and 38. The source 33 of titanium halide comprises a carrier gas supply 39 and a bubbler unit 40 which contains liquid titanium halide. The carrier gas is fed through a carrier gas supply line 41 to beneath the surface of the liquid titanium halide in the bubbler unit 40 and the carrier gas/titanium halide vapor contained in the bubbler unit 40 above the liquid surface flows into the supply line 34. It should be noted that the titanium halide could be supplied without the use of a gas carrier by employing a direct vaporization system, such as a heated supply system which directly vaporizes the liquid halide.

The high intensity light source 50 is preferably a laser. The light source can produce either a continuous beam, such as is produced by a $CO_2$ laser, or a pulsed beam, such as is produced by an excimer laser. In the embodiment depicted in the drawing, the beam 51 emanates from a $CO_2$ laser source and is directed through the reactor by a mirror 52. Obviously, the mirror need not be used as the light beam could aimed directly into the reactor 10.

The substrate mounting mechanism 70 comprises a mounting block 71 (arranged opposite the gas supply port 21), a block heater 72 and a thermocouple 73. The substrate mounting block 71 is designated to be movable in order to control the distance between the supply port 21 and a substrate 74 fixed on the mounting block. The block heater 72, such as an electric resistance heater, is employed to independently control the temperature of a substrate mounted on the mounting block 71. The thermocouple 73 contacts the surface of the substrate closest to the high intensity light beam.

An evacuation system 90, in conjunction with the electronic mass flow control units (Tylan Corp., Carson, CA), functions to control the reactions chamber pressure. The evacuation system 90 comprises a diffusion/mechanical pump combination 91 for initial reactor evacuation, which communicates with the reaction chamber 15 via an evacuation line 92 which is attached to the evacuation port 16. The evacuation system should be capable of producing a chamber pressure of about $10^{-6}$ torr. The evacuation system 90 includes a chemically resistant mechanical pump 93 (Alcatel, Hingham, MA) to maintain the reactor gas flow during the process. The evacuation line 92 is provided with a needle valve 94 which regulates the reaction chamber pressure.

The deposition of a layer on the substrate can be monitored by visually, mechanically or electrically inspecting the substrate surface during the process. A preferred monitoring mechanism is a system comprising an He—Ne laser 111 and a photodetector 113. In operation, a beam of light 112 emitted from the He—Ne laser 111 passes through the detector port 17 and is reflected by the substrate 74. The reflected beam passes through detector port 18 and strikes a photodetector 113. The photodetector 113 detects changes in the intensity of the reflected beam thus indicating the present or absence of a layer on the substrate. The photodetector is typically a photodiode manufactured by United Detector Technology, Inc., Santa Monica, CA. The photodetector generates signals in response to changes in reflected beam intensity. Any such changes are easily recorded and displayed, typically by using a chart recorder, manufactured by Hewlett-Packard, Palo Alto, CA.

Initially, a substrate is mounted on a heated mounting block with a thermocouple contacting the surface of the substrate upon which the layer is to be deposited. The substrate can be composed of any suitable material such as a wafer of silicon, polysilicon, alumina, silica, doped polysilicon, silicon nitride, composites of these materials, composites comprising metals and nonmetals, metals or metal alloys, composites of metals or metal alloys, glasses, etc. Preferably, the wafers comprise materials which are selected from the group consisting of silicon, polysilicon, doped polysilicon, alumina, silicon nitride or silica.

The substrate is preheated to a temperature which is below that temperature which would thermally induce a reaction between the reactants and between a reactant and the substrate (the critical temperature). Upon reaching the predetermined temperature, the substrate temperature is allowed to stabilize for a period of time (usually about 5–10 min.). The thermocouple continuously monitors the substrate temperature throughout the preheating, stabilization and reaction steps of the process. A novel feature of our invention is the substrate temperature, which can be maintained at about 500° C. or less.

Prior to feeding the reactants to the chamber, the chamber is initially evacuated to remove contaminants (e.g., $O_2$, $H_2O$). It should be understood that any one of a variety of evacuation systems can be employed which are capable of reducing the chamber pressure to about $10^{-6}$ torr (This value represents the preferred initial reaction chamber pressure). We prefer to use the diffusion/mechanical pump combination described supra. An inert gas (e.g., argon) is then introduced at the light transparent windows to avoid deposition of silicides thereon.

The reactant gases are then supplied to the reaction chamber. The reactants must be supplied to the reaction chamber at a temperature less than the critical temperature. In a preferred embodiment of the invention, the silicon containing compound (a gas at room temperature) is directly supplied to the chamber and the titanium halide (a liquid at room temperature) is supplied to the reaction chamber by a gas carrier. When a carrier gas is used to supply a reactant to the reaction chamber, it should not chemically react with the reactants. Preferred carrier gases include inert gases and hydrogen.

In accordance with the present invention, the titanium is introduced into the reactant chamber as titanium halide. The titanium halides can include titanium tetrachloride, titanium tetrafluoride, titanium tetrabromide and titanium tetraiodide. In addition to halides of principle valance, subhalides, e.g., subchlorides or subflourides could also be used. Further, mixtures of halides or halides and subhalides may also be used. Of the possible titanium halides, titanium tetrachloride and titanium tetraflouride are preferred. The most preferred titanium halide is titanium tetrachloride.

The source of silicon is introduced into the reactant chamber as a gaseous silicon containing compound. The preferred class of compounds are hydrosilicides (silanes), e.g., $SiH_4$, $Si_2H_6$, $Si_3H_8$, etc. Other potential sources of silicon include silicon tetrahalides, e.g., silicon tetrachloride and halogenated hydrosilicides, e.g., $SiH_3Cl$, $SiH_2Cl_2$ and $SiHCl_3$.

To induce a reaction, at least one of the gas of the titanium halide and the gas of the silicon-containing compound should absorb the high intensity light. In the event, however, that neither reactant absorbs the high intensity light, an additional chemically inert absorbing gas is supplied in order to induce the reaction. Such absorbing gases can include vinylchloride, perchloroethylene, trichloroethylene, Genetron®-11, Genetron®-12, Genetron®-113, Genetron®-114, $SiF_4$ and $SF_6$ with $SF_6$ being preferred for $CO_2$ laser excitation.

The flow ratio of the gas reactants (standard cubic cm/min. (SCCM) of gas of titanium halide/standard cubic cm/min. of gas of silicon-containing compound) is variable depending on the desired composition of the layer. The ratio corresponds to an atomic flow ratio which produces a particular stoichiometry of the titanium silicide. Depending on the specific atomic flow ratio, the film comprises titanium disilicide or titanium disilicide and at least one of a higher silicide (e.g. $Ti_5Si_3$ or TiSi) compound, and, optionally, silicon. The silicon, if present, exists as free silicon. For electrical device production, the atomic flow ratios range from about 2:1 to about 10:1.

The reaction which produces a conductive film is induced by high intensity light. High intensity light is defined as light waves (ultraviolet, visible or infrared) of sufficient intensity to thermally induce or photolytically induce (or both) a reaction between vapor phase reactants. Generally, a sufficient intensity of light to induce a reaction is at least about 10 watts/cm². Preferably, the high intensity light is produced by a laser. Among the usable lasers, the $CO_2$ laser and excimer laser are preferred. As stated heretofore, the light may be supplied as a continuous beam or as individual pulses. In addition, the light may be supplied as a specific wavelength of light corresponding to a frequency absorbed by at least one of the vapor phase reactants (e.g., a tunable $CO_2$ laser can produce high intensity light with a frequency of 944.2 cm$^{-1}$ corresponding to the P(20) emission line of the laser, which is strongly absorbed by $SiH_4$ reactant gas) or it may be supplied as a set of wavelengths of light (including at least one frequency which is absorbed by at least one of the vapor phase reactants).

It is believed that the high intensity light emanating from a $CO_2$ laser produces, primarily, a pyrolytic reaction. A pyrolytic reaction is a reaction wherein the vapor phase reactions are heated by collisions between absorbing and nonabsorbing reactant molecules to a temperature at which they decompose and react to produce the desired layer. When a $CO_2$ laser is employed, it is preferred that the intensity of light produced by the laser be at least about 100 watts/cm².

The reaction induced by an excimer laser is believed to be primarily a photolytic reaction. A photolytic reaction causes dissociation of at least one vapor phase reactant into free radicals which in turn react with the remaining reactants. When an excimer laser is employed, it is preferred that the laser produce at least about 10 pulses of light per second with each pulse lasting at least about 15 nanoseconds to yield an intensity on the order of megawatts per cm².

The production of a layer on the substrate is also dependent on the distance between the high intensity light and the substrate. The chamber pressure determines whether the reaction proceeds to produce a layer on the substrate. The pressure is regulated in response to the monitored condition of the substrate surface. The pressure is maintained at all times below about a few hundred torr and preferably between about 1 and 100 torr. With a reaction chamber pressure of 6 to 7 torr, a typical value for the distance between the beam and the substrate (as measured from the center of the beam to the surface of the substrate) is about 1 cm.

The reactants are supplied to the chamber through a nozzle. The nozzle is arranged opposite the substrate. Typically, the distance between the nozzle and the substrate is between about 2-7 cm. This distance is not critical to the production of a layer on the substrate surface.

The products produced by the process are either films comprising titanium silicide or composites comprising a substrate and the film. The films are substantially polycrystalline. The composition of the films can include stoichiometrically balanced silicides ($TiSi_2$ and higher silicides such as $Ti_5Si_3$, TiSi, etc.) or stoichiometrically unbalanced silicides. The films may also include silicon. The silicon exists as free silicon.

The thickness and resistivity of the film is variable depending on the desired structure and the intended use of the product. In integrated circuit components, such as for gates and gate interconnects, film thickness is between about 2,000 Å and about 10,000 Å (1 μm). The resistivity of the film is generally expressed in terms of the bulk resistivity and is determined from measurements of surface resistivity. Our novel process produces films having a bulk resistivity ($\rho$) below about 300 $\mu\Omega$-cm, generally below about 200 $\mu\Omega$-cm and in many instances less than or equal to about 100 $\mu\Omega$-cm.

A typical process for forming a titanium silicide film on a silicon wafer is described herein with reference to the preferred apparatus described below. A one inch (2.54 cm) diameter silicon wafer is mounted on the substrate holder. An electric resistance heater preheats the substrate to 450° C. The reactor, consisting of a stainless steel air-tight chamber, is then evacuated to $10^{-6}$ torr by a diffusion/mechanical pump system. Two streams of argon gas are delivered to the reaction chamber through ports located near the windows and act as purges preventing any deposition on the windows through which the light beam travels. $SiH_4$ (a gas at room temperature) is supplied from a lecture bottle. Titanium tetrachloride ($TiCl_4$, a liquid at room temperature) is contained in a reservoir [maintained in a thermoelectric cooler (CPA Products, Inc., Danvers, MA) at between about $-20°$ and $+10°$ C.] through which a stream of argon carrier gas is bubbled. The quantity of $TiCl_4$ entering the reactor is controlled by the argon flow and reservoir temperature. The SiH$_4$ and argon carrier gas flows are regulated by the electronic mass flow control units to produce a preselected atomic flow ratio of the reactants. The gases are mixed in a mixing line at a location just ahead of a particle filter. The reactants are continuously flowed through the reactor to provide constant sources of titanium and silicon for growing the titanium silicide containing film. Exhaust gases are continuously removed from the reactor by a chemically resistant mechanical pump. The total pressure in the reactor is maintained at about 6–7 torr as determined by the exhaust gas flow rate which is controlled with the needle valve. A CO$_2$ laser beam is directed through the reaction chamber between the substrate and nozzle with the distance between the nozzle and substrate being about 2 cm and the distance between the beam and substrate being about 1 cm. The CO$_2$ laser emits light corresponding to the P(20) transmission line at 944.2 cm$^{-1}$. This infrared frequency is strongly absorbed by the SiH$_4$. Film growth proceeds until the desired film thickness is produced. The product film will comprise polycrystalline titanium silicide.

The following examples specifically describe production of titanium silicide-containing films employing the process and apparatus described supra.

EXAMPLE 1

Titanium Silicide Film Grown at a 450° C. Substrate Temperature

Using the basic apparatus described above (including a 0.7 cm diameter laser beam, a 1 cm beam to substrate distance and a 7 cm nozzle to substrate distance) a film of titanium silicide was grown on a silicon single crystal wafer by the following procedure. The silicon substrate was mounted in the reactor and the vessel was evacuated to 10$^{-6}$ torr using the diffusion/mechanical pump combination to remove unwanted contaminants. Pumping was then switch to the chemically resistant mechanical pump and the argon flow was turned on to purge the inside of the light beam entrance and exit windows. The silicon substrate was preheated to 450° C. and allowed to stabilize. Next, the reactant gas flows were begun. The silane and argon carrier gas flows and the titanium tetrachloride reservoir temperature were adjusted to give a Si:Ti atomic flow ratio of approximately 4.7:1. The flowing reactant gases where exposed to a 160 watt CO$_2$ laser beam. The beam frequency was 944.2 cm$^{-1}$. The reactor pressure was increased, by reducing the pumping speed with the needle valve, to a pressure of 6–7 torr. Film growth commenced in this pressure range and was manifested as a change in the substrate reflectivity. Film growth continued for 20 mins. Thereafter, the radiation was stopped and the reactor gases were pumped away.

The thickness and the electrical resistivity of the film where measured [using a scanning stylus gauge (Alpha-Step by Tencor Instruments, Mtn. View, CA) and a 4-point probe, respectively] after the sample was removed from the reactor. The measured thickness was 7,000 Å and the bulk resistivity ($\rho$) was 200 $\mu\Omega$-cm. The molar composition of the film, as determined by Rutherford backscratching analysis, was TiSi$_{2.3}$.

EXAMPLE 2

Titanium Silicide Films Grown at 450° C. Substrate Temperature at Varying Si:Ti Reactant Flow Ratios A number of films where grown as described in Example 1 at a 450° C. substrate temperature with different Si:Ti flow ratios. The resulting film bulk resistivies are indicated in Table 1.

TABLE 1

Resulting Resistivities for Titanium Silicide Films Grown at 450° C.

| Si:Ti atomic flow ratio | $\rho$ ($\mu\Omega$-cm) |
|---|---|
| 4.0:1 | 100 |
| 4.3:1 | 200 |
| 4.6:1 | 200 |
| 4.7:1 | 200 |
| 6.5:1 | 300 |
| 6.5:1 | 200 |
| 7.3:1 | 100 |
| 7.3:1 | 100 |
| 12.0:1 | >1000 |

EXAMPLE 3

Analysis of Titanium Silicide Grown at 450° C. as Described in Example 1

A film grown at a Si:Ti atomic flow ratio of 7.3:1 in accordance with the process steps described in Example 1 was subjected to X-ray analysis. The results indicate the presence of crystalline TiSi$_2$ in this film as well as a silicon crystalline phase. The bulk resistivity as indicated in Table 1 is 100 $\mu\Omega$-cm.

EXAMPLE 4

Titanium Silicide Film Grown at a 500° C. Substrate Temperature

A titanium silicide film was grown as described in Example 1 with a substrate temperature maintained at 500° C. The resulting film had a measured thickness of 6,000 Å and a bulk resistivity of 60 $\mu\Omega$-cm. The film composition was TiSi$_{1.94}$ as analyzed by Rutherford backscattering. The difference in composition as compared to the composition described in Example 1 is believed to be due to a variation in the atomic flow ratio or the temperature difference of the substrate as compared to the substrate temperature in Example 1.

EXAMPLE 5

Figure 2A:
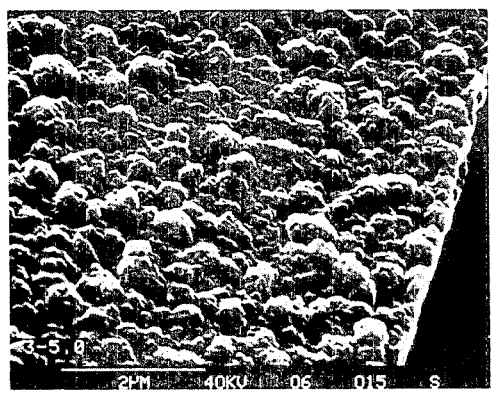
FIGS. 2a, 2b and 2c are scanning electron photomicrographs clearly showing the crystalline nature of the film.
Figure 2B:
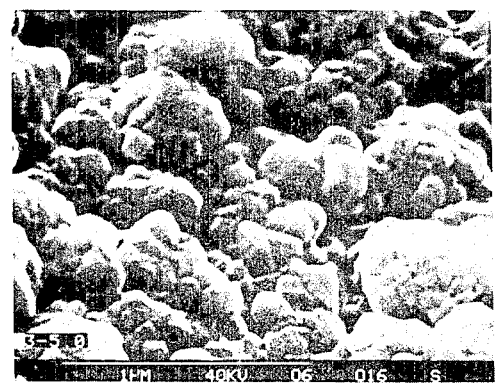
Figure 2C:
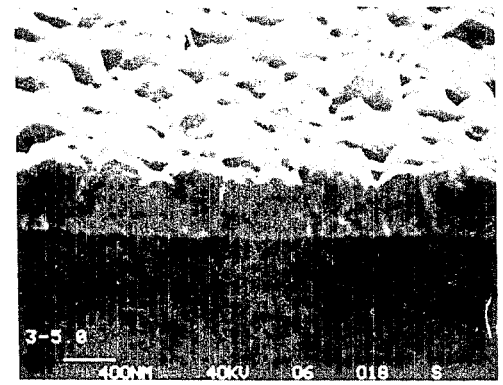

A titanium silicide film was grown as described in Example 1. The substrate temperature was maintained at 450° C. with a SiH$_4$/TiCl$_4$ flow ratio of about 6.0. Deposition was continued for 20 minutes at a reactor pressure of 10 torr resulting in a 3500 Å thick film with a bulk resistivity of 140 $\mu\Omega$-cm. Scanning electron microscope views of this film are shown in FIGS. 2a, 2b and 2c. The facets (angular surfaces), clearly visible in FIG. 2b, are indicative of the crystalline nature of the titanium silicide film. FIG. 2c shows a cleaved edge of the film and the underlying silicon substrate. These views illustrate the continuous coverage of the silicon wafer.

EXAMPLE 6

Figure 3A:
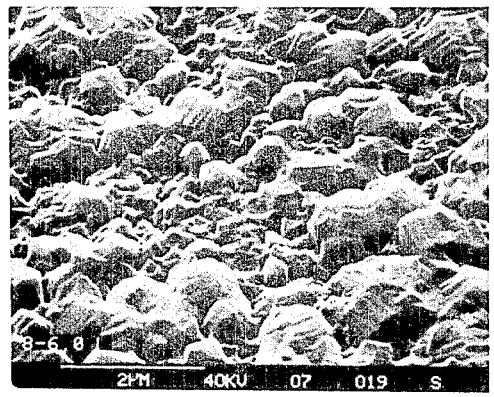
FIGS. 3a, 3b and 3c are scanning electron photomicrographs of a polycrystalline titanium silicide film formed under different conditions than the film shown in FIGS. 2a, 2b and 2c.
Figure 3B:
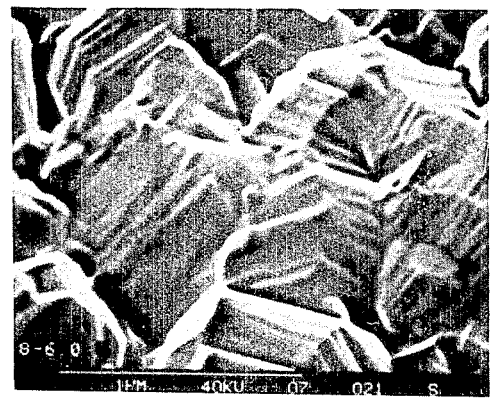
Figure 3C:
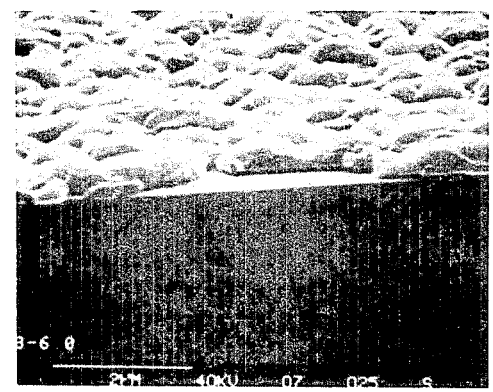

A titanium silicide film was grown as described in Example 1. The substrate temperature was maintained at 450° C. with a SiH$_4$/TiCl$_4$ flow ratio of about 5.0. The reactor pressure was maintained in the range of 8–9 torr for 15 minutes resulting in a titanium silicide film of 7000 Å thickness. Scanning electron micrograph views of this film are shown in FIGS. 3a, 3b and 3c. The morphology of this film is somewhat different from that shown in Example 5, with crystal planes being less in evidence (FIG. 3b). The bulk resistivity is, however, comparable to that in Example 5 ($\rho = 120$ $\mu\Omega$-cm) which indicates that the layer is polycrystalline. FIG. 3c shows the cleaved edge of the film and silicon substrate. Film coverage is seen to be continuous and quite uniform.

We claim:

1. A process for the production of films comprising titanium silicide on substrates, the process comprising the steps of:
   (a) providing a substrate at a processing site;
   (b) supplying gas phase reactants comprising a titanium halide and a silicon containing compound to the processing site;
   (c) exposing the gas phase reactants at the processing site to high intensity light;
   (d) exposing a surface of the substrate to the exposed gas phase reactants to cause a film comprising a metal silicide to be deposited thereon; and
   (e) maintaining the substrate, during steps (b), (c) and (d), at a predetermined temperature below that temperature which would induce a thermal reaction between the gas phase reactants.

2. The process of claim 1 further comprising the step of heating the substrate to the predetermined temperature by a source of heat other than the heat generated by the exposed gas phase reactants.

3. The process of claim 1 further comprising the step of heating the substrate to the predetermined temperature prior to the step of supplying the gas phase reactants.

4. The process of claim 2 wherein the substrate is heated to a temperature equal to or less than about 500° C.

5. The process of claim 1 wherein the titanium silicide is polycrystalline.

6. The process of claim 3 wherein the substrate is heated to a temperature equal to or less than about 500° C.

7. The process of claim 5 wherein the substrate is heated to a temperature equal to or less than about 500° C.

8. The process of claim 5 wherein the substrate is heated to a temperature equal to about 450° C.

9. The process of claim 3 wherein the metal silicide is polycrystalline.

10. The process of claim 9 wherein the substrate is heated to a temperature equal to or less than about 500° C.

11. The process of claim 9 wherein the substrate is heated to a temperature of about 450° C.

12. The process of claim 1 wherein the high intensity light is provided as a concentrated beam of light with an intensity of at least about 10 W/cm$^2$.

13. The process of claim 12 wherein the concentrated beam of light is produced by a laser.

14. The process of claim 13 wherein the laser is a CO$_2$-laser.

15. The process of claim 1 wherein the titanium halide is titanium tetrachloride or titanium tetrafluoride.

16. The process of claim 15 wherein the silicon containing compound is selected from the group consisting of Si$_x$H$_{2x+2}$.

17. The process of claim 15 wherein the silicon containing compound is SiH$_4$.

18. The process of claim 1 wherein the gases are supplied in quantities to produce titanium silicide having a stoichiometrically unbalanced composition.

19. The process of claim 5 wherein the film further comprises silicon.

20. The process of claim 1 wherein the substrate comprises a material selected from the group consisting of alumina, silicon, polysilicon, doped polysilicon, silicon nitride and silica.

21. The process of claim 5 wherein the gases are supplied in quantities to produce titanium silicide having a stoichiometrically unbalanced composition.

22. The process of claim 1 wherein at least one of the gas phase reactants comprising the titanium halide and the silicon containing compound absorbs the high intensity light.

23. The process of claim 1 wherein the gas phase reactants also include a chemically inert gas which absorbs the high intensity light.

* * * * *